United States Patent
Zhao et al.

(10) Patent No.: US 6,961,553 B2
(45) Date of Patent: Nov. 1, 2005

(54) BIDIRECTIONAL DISTRIBUTED AMPLIFIER

(75) Inventors: Lei Zhao, Chandler, AZ (US); Anthony Pavio, Paradise Valley, AZ (US)

(73) Assignee: Motorola, Inc., Schaumburg, IL (US)

( * ) Notice: Subject to any disclaimer, the term of this patent is extended or adjusted under 35 U.S.C. 154(b) by 323 days.

(21) Appl. No.: 10/412,462

(22) Filed: Apr. 11, 2003

(65) Prior Publication Data

US 2004/0202311 A1 Oct. 14, 2004

(51) Int. Cl.⁷ ................................................ H04B 1/10
(52) U.S. Cl. .................... 455/311; 459/127.3; 459/323; 459/333; 459/341; 330/128; 330/302
(58) Field of Search ................................ 455/325, 333, 455/339, 341, 340, 127.3, 78, 126, 318, 323, 90.3, 575.1, 80, 440.1, 128, 292.1, 293.2, 311–313, 319, 308; 330/128–133, 285, 302–306, 294, 288; 333/103–104, 33

(56) References Cited

U.S. PATENT DOCUMENTS 5,969,575 A * 10/1999 Helms ......................... 330/294
6,489,843 B1 * 12/2002 Nishijima et al. ............. 330/51
2002/0034934 A1 * 3/2002 Watanabe et al. ........... 455/318
2003/0001787 A1 * 1/2003 Clifton ........................ 343/702
2003/0201827 A1 * 10/2003 Ohnishi et al. .............. 330/133

* cited by examiner

*Primary Examiner*—Pablo N. Tran

(57) ABSTRACT

A bidirectional amplifier circuit includes first and second input ports, first and second output ports, a power amplifier, and first, second, third, and fourth filter circuits. The power amplifier includes at least first and second input terminals and first and second output terminals. The first filter circuit is coupled between the first input port and the power amplifier first input terminal. The second filter circuit is coupled between the second input port and the power amplifier second input terminal. The third filter circuit is coupled between the first output port and the power amplifier first output terminal. The fourth filter circuit is coupled between the second output port and the power amplifier second output terminal. Carrier waves of differing frequencies may be injected into the amplifier circuit first and second input ports, and transmitted from the first and second output ports. The configuration provides broadband operation with flat gain and high efficiency at the frequencies of each of the carrier waves.

14 Claims, 4 Drawing Sheets

BIDIRECTIONAL DISTRIBUTED AMPLIFIER

FIELD OF THE INVENTION

The present invention generally relates to bidirectional amplifiers and, more particularly, to a bidirectional distributed amplifier that simultaneously amplifies a plurality of frequency bands without implementing any band switching.

BACKGROUND OF THE INVENTION

The development of high speed communications protocols, and the hardware to implement these protocols, brought about the capability for numerous computers to communicate with one another over a so-called local area network (LAN). Presently, many organizations have LANs, which allow the organization's employees to communicate with one another, and collaborate on various projects, each from their own computer workstation. One drawback of LANs, at least until recent years, was that LAN access was limited to a physical hardware infrastructure. In other words, users could only connect to a LAN node through some physical hardware, be it a network cable or a telephone land line.

More recently, wireless LAN technology was developed to overcome at least some of the drawbacks of physical connectivity of wired LANs. A wireless LAN can either replace or extend a wired LAN. In a wireless LAN data may be transmitted and received via radio frequency (RF) waves. Specifically, to transmit data from one wireless LAN node to another, data modulates an RF carrier wave, which the node then transmits to one or more receiving nodes. The receiving nodes may then demodulate the data from the transmitted carrier wave.

In order to provide consistency for wireless LAN data transmission, a standard was developed by the Institute of Electrical and Electronics Engineers (IEEE). The standard, known as IEEE 802.11, provides a specification for over-the-air interface between nodes in a wireless LAN. The IEEE 802.11 standard includes several specifications and provides for data transmission rates from 1 Megabits per second (Mbps) up to 54 Mbps, depending on the frequency of the carrier wave and the transmission paradigm employed. For example, IEEE 802.11(a) provides up to 54 Mbps using a 5.8 GHz carrier wave and an orthogonal frequency division multiplexing encoding scheme, and IEEE 802.11(b) provides up to 11 Mbps using a 2.4 GHz carrier wave and direct sequence spread spectrum (DSSS) transmission.

Presently, many wireless LAN transmitters include integrated circuits (ICs) that are designed to implement both the IEEE 802.11(a) and 802.11(b) standards. Thus, these ICs may have two output ports, one for 2.4 GHz and one for 5.8 GHz. In addition, these ICs may employ two separate power amplifiers, one for each of these carrier frequencies. Alternatively, if a single power amplifier is provided, then the IC may include switching circuitry to reconfigure the IC for operation at the different frequencies. In either case, providing additional circuitry can increase circuit design complexity and cost, as well as IC manufacturing costs.

Hence, there is a need for a circuit that can be used to implement both the IEEE 802.11(a) and (b) standards that does not rely on two power amplifiers or on potentially complex switching circuitry. The present invention addresses these needs.

BRIEF DESCRIPTION OF THE DRAWINGS

The present invention will hereinafter be described in conjunction with the following drawing figures, wherein like numerals denote like elements, and.

DETAILED DESCRIPTION OF A PREFERRED EMBODIMENT

The following detailed description is merely exemplary in nature and is not intended to limit the invention or the application and uses of the invention. Furthermore, there is no intention to be bound by any expressed or implied theory presented in the preceding background of the invention or the following detailed description.

Figure 1:
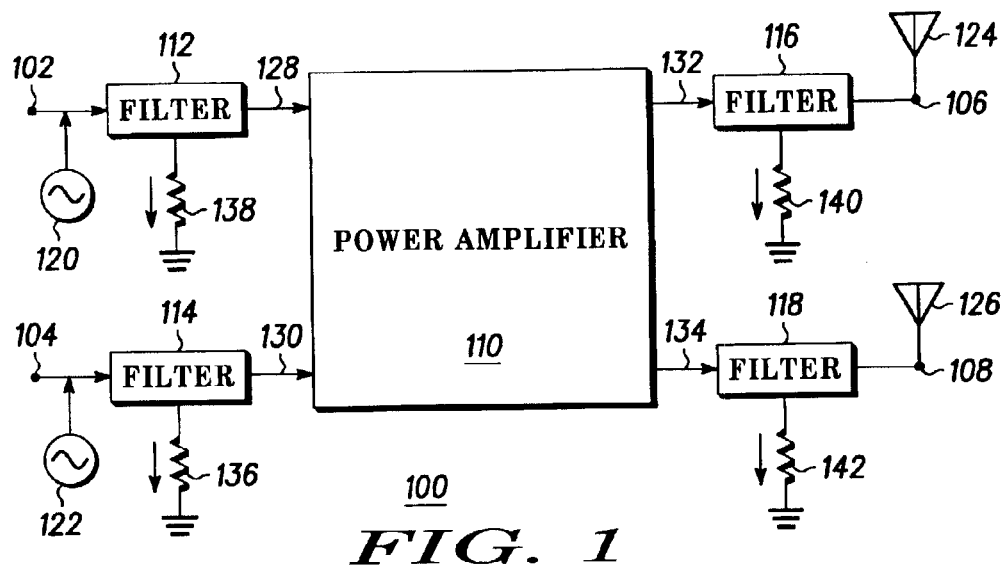
FIG. 1 is a functional block diagram of a bidirectional distributed amplifier according to an exemplary embodiment of the present invention.

A functional block diagram of an exemplary bidirectional distributed amplifier circuit is depicted in FIG. 1. The amplifier circuit 100 includes first 102 and second 104 input ports, first 106 and second 108 output ports, a power amplifier 110, and four filter circuits, a first filter circuit 112, a second filter circuit 114, a third filter circuit 116, and a fourth filter circuit 118. The first 102 and second 104 input ports are each adapted receive a signal from a signal source, which may be a modulated signal source. For example, in the embodiment depicted in FIG. 1, the first 102 and second 104 input ports are coupled to a first 120 and a second 122 signal source, respectively. The first 106 and second 108 output ports are each adapted to couple to a signal transmission device such as, for example, an antenna. Indeed, in the embodiment depicted in FIG. 1, the first 106 and second 108 output ports are coupled to a first 124 and a second 126 radio frequency (RF) transmission antenna, respectively.

The power amplifier 110 is a multi-input/multi-output power amplifier that includes at least a first 128 and a second 130 input terminal, and a first 132 and a second 134 output terminal. The power amplifier 110, an exemplary embodiment of which is discussed in more detail further below, is preferably a distributed amplifier that is made up of individual amplifier stages, each of which has an input coupled to both the first 128 and second 130 input terminals, and an output coupled to both the first 132 and second 134 output terminals.

The first filter circuit 112 is coupled between the first input port 102 and the power amplifier first input terminal 128, the second filter circuit 114 is coupled between the second input port 104 and the power amplifier second input terminal 130, the third filter circuit 116 is coupled between the first output port 106 and the power amplifier first output terminal 132, and the fourth filter circuit 118 is coupled between the second output port 108 and the power amplifier second output terminal 134. It is noted that the first 112 and second 114 filter circuits are each preferably configured as a low-pass/high-pass filter combination circuits. Thus, the first 112 and second 114 filter circuits each include both a low-pass filter and a high-pass filter. However, the third 116 and fourth 118 filter circuits are each preferably configured as so-called "frequency traps," which shunt frequencies at and around its resonant frequency to ground or other reference potential, preferably via a load resistor. It is noted that the particular configuration of the low-pass and high-pass filters that make up the first 112 and second 114 filter circuits depends, at least in part, on the carrier wave frequency being supplied to, and transmitted from, the amplifier circuit 100. Moreover, the cut-off frequency of each of the low-pass and high-pass filters that make up the first 112 and second 114 filter circuits, and the resonant frequency of each of the third 116 and fourth 118 filter circuits, also depends on carrier wave frequency being supplied to, and transmitted from, the amplifier circuit 100.

Figure 2:
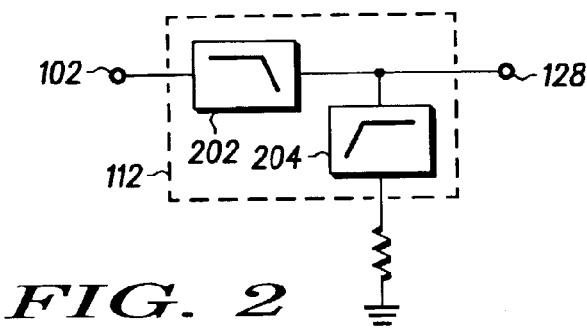
FIGS. 2 and 3 are each functional block diagrams of exemplary filter circuits that may be used to implement the amplifier of FIG. 1.
Figure 3:
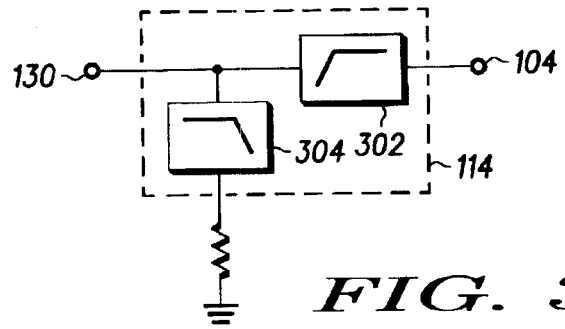

Specifically, the first frequency source 120 supplies a carrier wave at a first frequency magnitude to the first filter circuit 112, and the second frequency source 122 supplies a carrier wave at a second frequency magnitude, which is higher than the first frequency magnitude, to the second filter circuit 114. Thus, as shown more particularly in FIG. 2, the first filter circuit 112 includes a low-pass filter 202, which is electrically coupled between the amplifier circuit first input port 102 and the power amplifier first input terminal 128, and a high-pass filter 204, which is electrically coupled between the power amplifier first input terminal 128 and a reference potential (preferably via a resistive component which is discussed below). Conversely, as shown in FIG. 3, the second filter circuit 114 includes a high-pass filter 302, which is electrically coupled between the amplifier circuit second input port 104 and the power amplifier second input terminal 130, and a low-pass filter 304, which is electrically coupled between the power amplifier second input terminal 130 and the reference potential (also preferably via a resistive component). The cut-off frequencies of both of the low-pass filter circuits 202 and 304 are substantially equivalent, and have magnitudes that are preferably above the first frequency magnitude and below the second frequency magnitude. Similarly, the cut-off frequencies of both of the high-pass filter circuits 204 and 302 are substantially equivalent, and have magnitudes that are preferably above the first frequency magnitude and below the second frequency magnitude. The magnitudes of the low-pass and high-pass filter cut-off frequencies are preferably different, with the cut-off frequency of the high-pass filters 204 and 302 preferably being higher than that of the low-pass filters 202 and 304.

Figure 4:
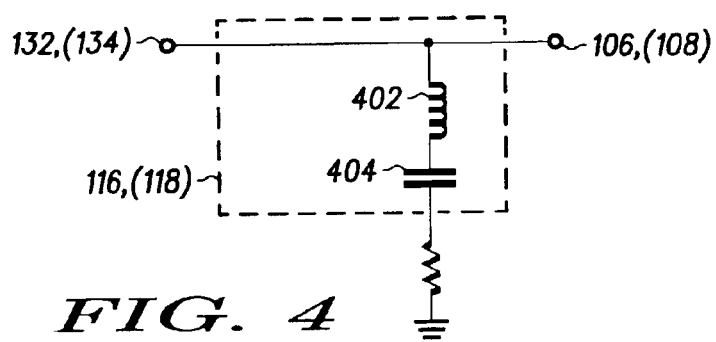
FIG. 4 is a schematic diagram of yet another exemplary filter circuit that may be used to implement the amplifier of FIG. 1.

The third 116 and fourth 118 filters, as was noted above, are preferably configured as frequency traps. In a particular preferred embodiment, which is shown in FIG. 4, the third 116 and fourth 118 filters each include an inductive element 402 and a capacitive element 404 electrically coupled to form a series L-C resonant circuit. It will be appreciated that third 116 and fourth 118 filter circuits could be implemented using various other circuit components. The resonant frequency of the third filter circuit 116 is preferably set to about the first frequency magnitude, and the resonant frequency of the fourth filter circuit 118 is preferably set to about the second frequency magnitude.

With the above described filter circuit configurations, frequencies at or below the cut-off frequency of the first filter circuit low-pass filter 202 are passed through to the power amplifier first input terminal 128, whereas frequencies at or above the first filter circuit low-pass filter 202 are attenuated. Similarly, frequencies at or above the cut-off frequency of the second filter circuit high-pass filter 302 are passed through to the power amplifier second input terminal 130, whereas frequencies at or below the second filter circuit high-pass filter 302 are attenuated. In addition, a portion of the frequencies that pass through the first filter circuit low-pass filter 202 are dropped across a first load resistor 136, via the second filter circuit low-pass filter 304. Similarly, a portion of the frequencies that pass through the second filter circuit high-pass filter 302 are dropped across a second load resistor 138, via the first filter circuit high-pass filter 204. The first 136 and second 138 load resistors need not have equivalent resistance values, and the values of each are chosen to implement the desired circuit operation and/or performance.

At the power amplifier first output terminal 132, frequencies at or around the first frequency magnitude are shunted to ground through a third load resistor 140, whereas other frequencies pass through to the first transmission antenna 124. Similarly, at the power amplifier second output terminal 134, frequencies at or around the second frequency magnitude are shunted to ground through a fourth load resistor 142, whereas other frequencies pass through to the second transmission antenna 126. The third 140 and fourth 142 load resistors, like the first 136 and second 138 load resistors, need not have equivalent resistance values, and the values of each are chosen to implement the desired circuit operation and/or performance.

Figure 5:
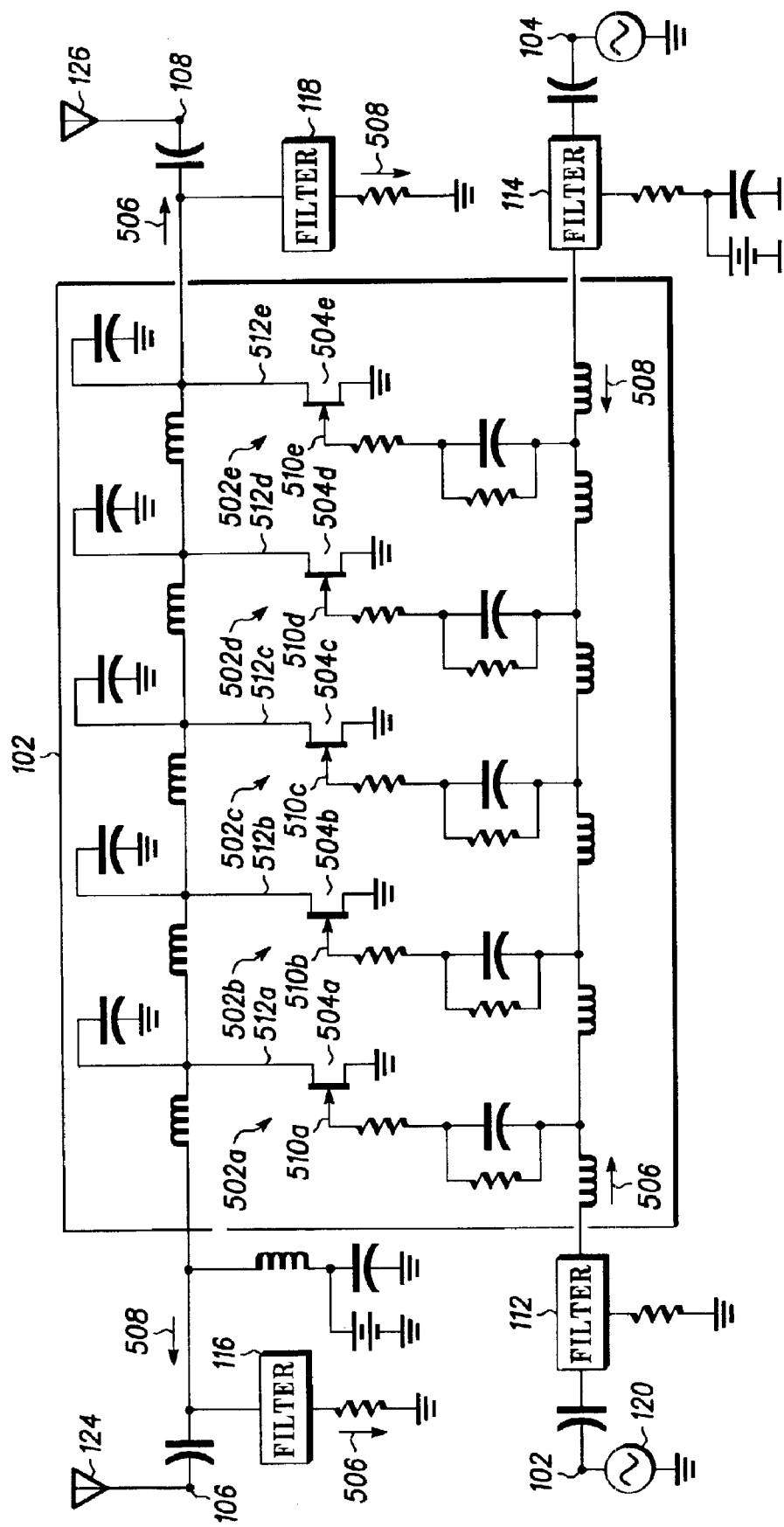
FIG. 5 is a schematic representation of a particular implementation of the amplifier depicted in FIG. 1.

Turning now to FIG. 5, a particular exemplary embodiment of the bidirectional distributed amplifier circuit 100 described above will be provided. In the depicted embodiment, in which like reference numerals refer to like components of FIG. 1, it is seen that the power amplifier 102 is comprised of a plurality of substantially identical amplifier circuits 502a–e. Each amplifier circuit 502a–e is preferably a transistor amplifier circuit, and even more preferably, are transistor amplifier circuits in which the active elements are one or more GaAs-type FETs 504a–e. Although five substantially identical amplifier circuits 502 are depicted, it will be appreciated that more or less than this number could be used to implement the power amplifier 102. Additionally, transistors 504a–e optionally could be bipolar transistors instead of FETs.

The filter circuits 112–118 are depicted in block diagram form in FIG. 5 since each of the filter circuits 112–118 could be implemented using any one of numerous component implementation schemes. For example, each of the filter circuits 112–118 could be implemented using only passive circuit elements (e.g., inductive, capacitive, resistive components) or passive elements in combination with one or more active elements (e.g., op-amps). It is additionally noted that the filter circuits 112–118 could be implemented in any one of numerous configurations other than that described above. For example, although the first 112 and second 114 filter circuits are not configured as frequency-traps, these filter circuits could be so configured. In other words, rather than being implemented as a low-pass/high-pass filter combinations, the first 112 and second 114 filter circuits could be implemented as frequency traps. Similarly, rather than being implemented as frequency traps, the third 116 and fourth 118 filter circuits could be configured as low-pass/high-pass filter combinations. It will additionally be appreciated that the filter circuits 112–118 could be implemented as band-pass filters, which could be appropriately configured to pass frequencies in their pass bands, either to other circuit elements or to ground.

Having described the bidirectional distributed amplifier circuit 100 from an electrical configuration standpoint both generally and specifically, a description of its operation will now be provided. In doing so, reference should be made to FIG. 5. It should also be noted that this operational description is predicated on the circuit being implemented for operation in accordance with IEEE standard 802.11. Thus, the first signal source 120 supplies a first carrier wave signal 506 at a frequency of approximately 2.4 GHz, and the second signal source 122 supplies a second carrier frequency signal 508 at a frequency of approximately 5.8 GHz. With these particular frequencies, the low-pass filters 202 and 304 are implemented with cut-off frequencies of about 3.5 GHz, the high-pass filters 204 and 302 are implemented with cut-off frequencies of about 3.7 GHz, the third filter circuit 116 is implemented with a resonant frequency of about 2.4 GHz, and the fourth filter circuit 118 is implemented with a resonant frequency of about 5.8 GHz.

The 2.4 GHz carrier wave signal and the 5.8 GHz carrier wave signal, both of which are preferably modulated with data, are coupled to the first 112 and second 114 filter circuits, respectively. It is noted that the particular scheme used to modulate the carrier wave signals may be any one of numerous modulation schemes known in the art. The first 112 and second 114 filter circuits attenuate frequency components above and below, respectively, their cut-off frequencies, and pass the remaining frequency components of the first 506 and second 508 carrier wave signals to the power amplifier 102.

The first 506 and second 508 carrier wave signals are simultaneously supplied to the gate terminals 510a–e of each FET 504a–e. The amplified first 506 and second 508 carrier waves propagate from the drain terminals 512a–e of each FET 504a–e toward the first 106 and second 108 amplifier circuit output ports. However, the third filter circuit 116, which is implemented as a 2.4 GHz trap, shunts the amplified first carrier wave 506 through the third load resistor 140 to ground. Similarly, the fourth filter circuit 118, which is implemented as a 5.8 GHz trap, shunts the amplified second carrier wave 508 through the fourth load resistor 142 to ground. Thus, the amplified first carrier wave signal 506 is transmitted via the second antenna 126, and the second carrier wave signal 508 is transmitted via the first antenna 124.

Figure 6:
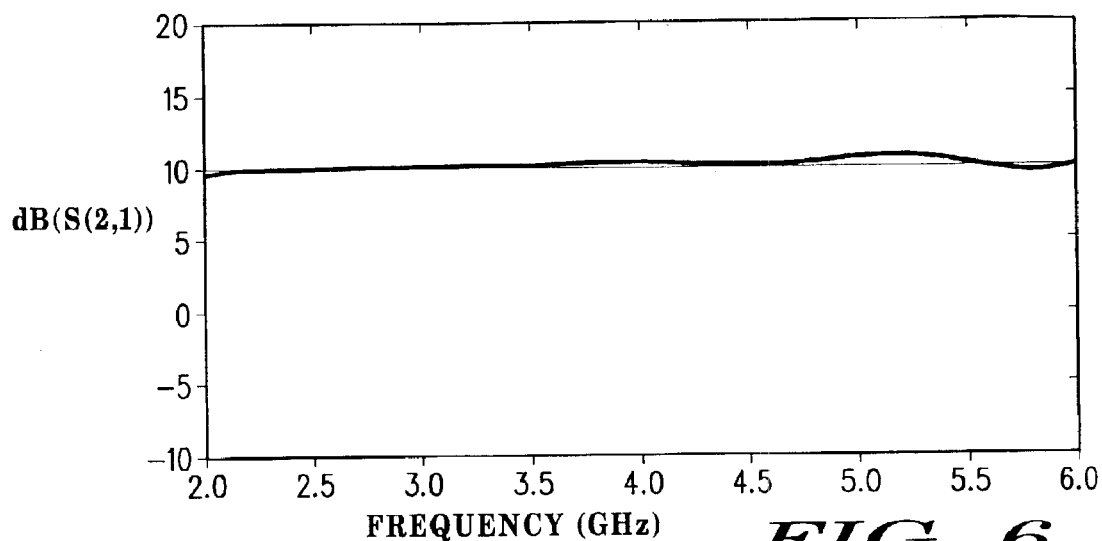
FIGS. 6–8 illustrate amplifier gain characteristics for the amplifier of FIG. 5 and a conventional amplifier.
Figure 7:
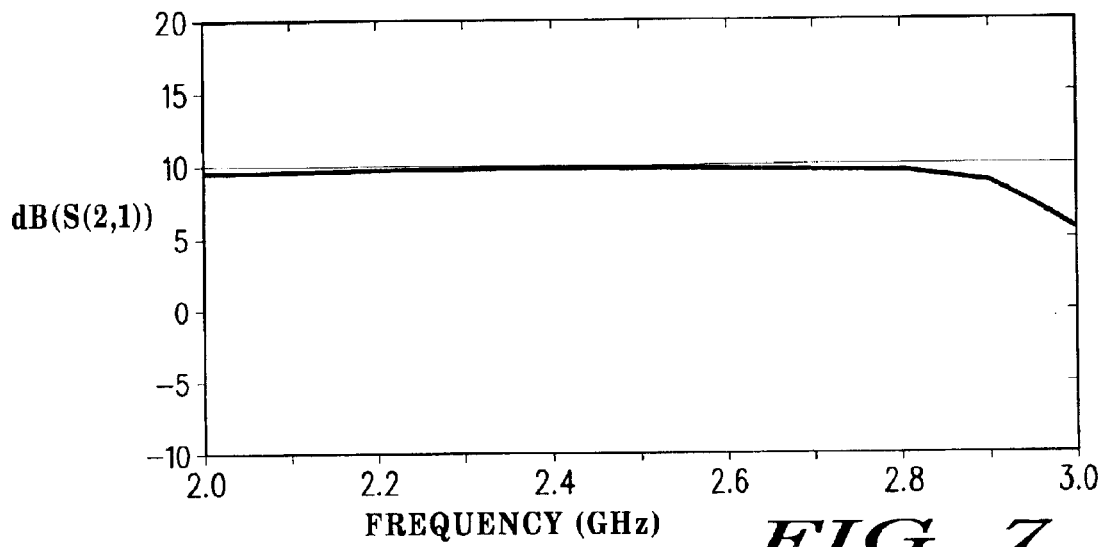
Figure 8:
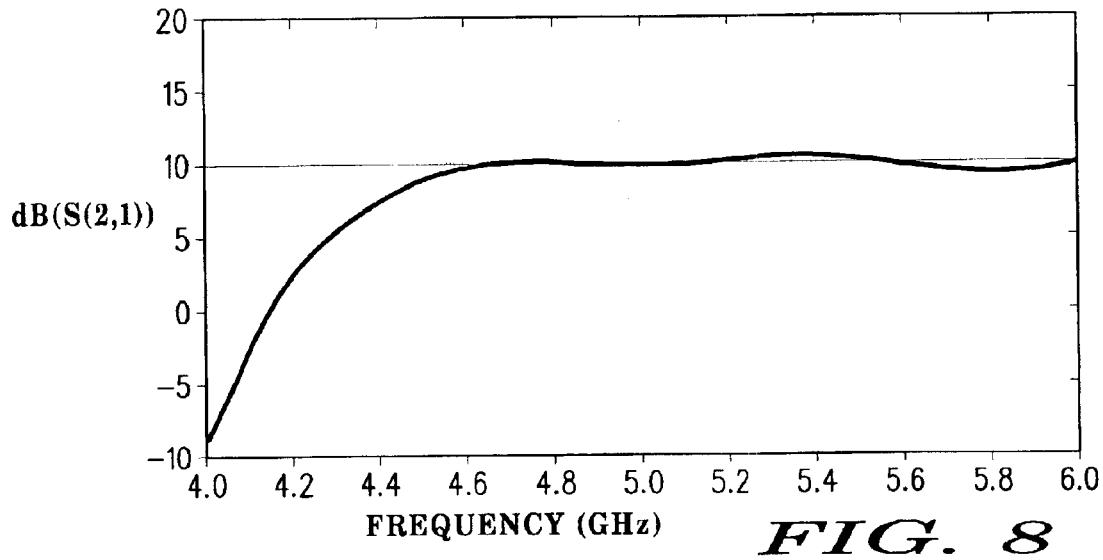

With the bidirectional distributed amplifier circuit configuration described herein, each of the carrier wave signals is presented with an appropriate amount of termination impedance at both the power amplifier input 128, 130 and output 132, 134 terminals. The configuration provides broadband operation with flat gain and high efficiency at the frequencies of each of the carrier waves. An exemplary frequency gain plot for a conventional distributed amplifier is illustrated in FIG. 6, and exemplary frequency-gain plots for the amplifier circuit 100 of FIG. 2, at the first 116 and second 118 output terminals are illustrated FIGS. 7 and 8, respectively.

Figure 9:
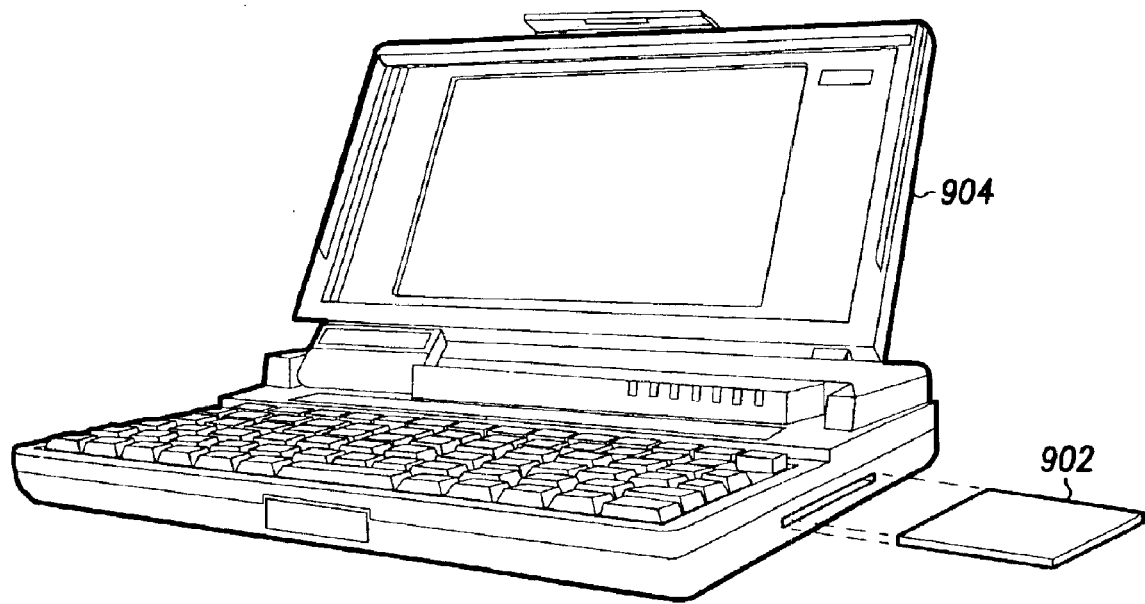
FIG. 9 depicts an exemplary embodiment of a wireless network interface card that may incorporate the amplifier circuit of FIG. 5, and which is inserted into one or more personal computers to enable communication via a wireless local area network.

In a particular preferred embodiment, the amplifier circuit 100 forms part of a wireless network interface card (NIC). As illustrated in FIG. 9, the NIC 902 may be inserted into an appropriate port or slot of a personal computer (PC) 904, which may be either a conventional workstation PC or a portable PC, such as a laptop computer. The PC 904 may then communicate with other suitably equipped PCs 904, either directly or via a wireless LAN router.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A bidirectional distributed amplifier circuit having at least first and second input ports and first and second output ports, comprising:
    a power amplifier having at least first and second input terminals and first and second output terminal;
    a first low-pass filter coupled between the first input port and the power amplifier first input terminal;
    a first high-pass filter coupled between the power amplifier first input terminal and a first load resistor;
    a second low-pass filter coupled between the power amplifier second input port and a second load resistor;
    a second high-pass filter coupled between the second input port and the power amplifier second input terminal;
    a first frequency trap coupled between the power amplifier first output terminal and both the first output port and a third load resistor; and
    a second frequency trap coupled between the power amplifier second output terminal and both the second output port and a fourth load resistor.

2. The amplifier of claim 1, wherein the power amplifier comprises a plurality of transistor amplifiers electrically coupled in parallel with one another.

3. The amplifier circuit of claim 2, wherein each transistor amplifier comprises a FET including a gate terminal, a source terminal, and a drain terminal.

4. The amplifier circuit of claim 3, wherein:
    the power amplifier input terminal is coupled to the gate terminal of each FET; and
    the power amplifier output terminal is coupled to the drain terminal of each FET.

5. The amplifier circuit of claim 2, wherein each transistor amplifier comprises a bipolar transistor including a base terminal, an emitter terminal, and a collector terminal.

6. The amplifier circuit of claim 1, further comprising:
    a first signal source coupled to the first input port and operable to supply a first signal having a first frequency magnitude; and
    a second signal source coupled to the second input port and operable to supply a second signal having a second frequency magnitude.

7. The amplifier circuit of claim 6, wherein the first and second frequency magnitudes are approximately 2.4 GHz and 5.8 GHz, respectively.

8. A network interface card configured to be inserted into a personal computer to allow at least data transmission to a wireless network, comprising:
    a power amplifier having at least first and second input terminals and first and second output terminal;
    a first low-pass filter coupled between the first input port and the power amplifier first input terminal;
    a first high-pass filter coupled between the power amplifier first input terminal and a first load resistor;
    a second low-pass filter coupled between the power amplifier second input port and a second load resistor;

a second high-pass filter coupled between the second input port and the power amplifier second input terminal;

a first frequency trap coupled between the power amplifier first output terminal and both the first output port and a third load resistor; and a second frequency trap coupled between the power amplifier second output terminal and both the second output port and a fourth load resistor.

9. The amplifier of claim 8, wherein the power amplifier comprises a plurality of transistor amplifiers electrically coupled in parallel with one another.

10. The amplifier circuit of claim 9, wherein each transistor amplifier comprises a FET including a gate terminal, a source terminal, and a drain terminal.

11. The amplifier circuit of claim 10, wherein:

the power amplifier input terminal is coupled to the gate terminal of each FET; and the power amplifier output terminal is coupled to the drain terminal of each FET.

12. The amplifier circuit of claim 9, wherein each transistor amplifier comprises a bipolar transistor including a base terminal, an emitter terminal, and a collector terminal.

13. The amplifier circuit of claim 8, further comprising:

a first signal source coupled to the first input port and operable to supply a first signal having a first frequency magnitude; and a second signal source coupled to the second input port and operable to supply a second signal having a second frequency magnitude.

14. The amplifier circuit of claim 13, wherein the first and second frequency magnitudes are approximately 2.4 GHz and 5.8 GHz, respectively.

* * * * *